United States Patent
Binnard et al.

(10) Patent No.: US 7,466,396 B2
(45) Date of Patent: Dec. 16, 2008

(54) LITHOGRAPHY APPARATUS AND METHOD UTILIZING PENDULUM INTERFEROMETER SYSTEM

(75) Inventors: Michael B. Binnard, Belmont, CA (US); Douglas C. Watson, Campbell, CA (US); W. Thomas Novak, Hillsborough, CA (US); Hiroto Horikawa, Kumagaya (JP); Yoshifumi Nakakoji, Kumagaya (JP); Hideaki Sakamoto, Kumagaya (JP)

(73) Assignee: Nikon Corporation, Tokyo (JP)

( * ) Notice: Subject to any disclaimer, the term of this patent is extended or adjusted under 35 U.S.C. 154(b) by 73 days.

(21) Appl. No.: 11/546,368

(22) Filed: Oct. 12, 2006

(65) Prior Publication Data

US 2007/0139635 A1    Jun. 21, 2007

Related U.S. Application Data

(60) Provisional application No. 60/725,662, filed on Oct. 13, 2005.

(51) Int. Cl.
*G03B 27/74* (2006.01)

(52) U.S. Cl. ..................................... 355/68

(58) Field of Classification Search ............ 355/68, 355/67, 53
See application file for complete search history.

(56) References Cited

U.S. PATENT DOCUMENTS

| | | | |
|---|---|---|---|
| 6,144,442 A | 11/2000 | 'T Mannetje et al. | |
| 6,246,204 B1 | 6/2001 | Ebihara et al. | |
| 6,323,935 B1 * | 11/2001 | Ebihara et al. | ............ 355/53 |
| 6,337,484 B1 | 1/2002 | Loopstra et al. | |
| 6,473,161 B1 | 10/2002 | Cuijpers et al. | |
| 2004/0000215 A1 | 1/2004 | Phillips et al. | |

FOREIGN PATENT DOCUMENTS

| | | |
|---|---|---|
| JP | A-60-78125 | 5/1985 |
| WO | WO 2006/038952 A2 | 4/2006 |

* cited by examiner

*Primary Examiner*—Peter B Kim
*Assistant Examiner*—Chia-how Michael Liu
(74) *Attorney, Agent, or Firm*—Oliff & Berridge, PLC

(57) ABSTRACT

Reticle and/or wafer stage interferometers are mounted to a supporting body that is separate from the body that supports the projection optical system of a lithography apparatus. This enables the size of the body supporting the projection optical system to be reduced so that it has more favorable dynamic characteristics.

56 Claims, 4 Drawing Sheets

LITHOGRAPHY APPARATUS AND METHOD UTILIZING PENDULUM INTERFEROMETER SYSTEM

CROSS-REFERENCE TO RELATED APPLICATION

This application claims the benefit of U.S. Provisional Application No. 60/725,662 filed Oct. 13, 2005. The disclosure of U.S. Provisional Application No. 60/725,662 is incorporated herein by reference in its entirety.

BACKGROUND

This invention relates to lithography apparatus and methods of performing lithographic exposure, commonly used to transfer a pattern onto a substrate in order to manufacture devices such as, for example, semiconductor devices, liquid crystal displays, etc.

Many current lithography apparatus have a large body structure that holds the projection lens, the metrology system and that supports the reticle stage and components of the illumination unit. FIGS. 1 and 2 show such an apparatus. In particular, body 20, which can be mounted on a base 100, includes one or more platforms and a plurality of columns, and supports a projection optical system 60 and a reticle stage 80. The metrology system also is mounted to the body 20. The metrology system includes laser interferometers 30 for measuring the position of the wafer stage 70, laser interferometers 40 for measuring the position of the reticle stage 80, and other sensors such as auto-focus sensors for measuring the vertical position of the wafer and/or reticle and alignment microscopes, etc. (generally represented by 50).

The body 20 is designed to hold all of the metrology elements in a fixed position relative to the projection optical system 60. Of course, some vibrations and distortions occur and cause degradation of the lithography apparatus performance.

One problem with existing lithography apparatus is that the body 20 is a relatively large structure, and therefore has undesirably low vibration frequencies. One contributing factor to the large size of the body is that the stage interferometers 30 and 40 are located relatively far from the projection optical system. Accordingly, when the interferometers are mounted to the same body that supports the projection optical system and other components of the lithography apparatus, that body becomes large.

SUMMARY

According to aspects of the invention, the reticle and/or wafer stage interferometers are mounted to a supporting body to define an interferometer unit that is separate from the body that supports the projection system. This enables the size of the body supporting the projection system to be reduced so that it has more favorable dynamic characteristics.

According to preferred embodiments, the interferometer unit is suspended. This is beneficial in that the interferometer unit can be isolated from background vibrations.

According to one aspect of the invention, a lithography apparatus includes a projection system, a stage for holding an object and an interferometer unit. The interferometer unit mounts an interferometer that emits a first measurement beam to the projection system and that emits a second measurement beam to the stage. A position of the stage relative to the projection system is determined from the first and second measurement beams. The interferometer unit is suspended from a support member and is movable relative to the projection system.

At least one suspension member is disposed between the interferometer unit and the support member so as to flexibly suspend the interferometer unit from the support member. The suspension member preferably is stiff in an axial direction and is flexible in directions orthogonal to the axial direction. However, according to some embodiments, the suspension member can be flexible in its axial direction.

According to some embodiments, the suspension member is a wire or a rod. The wire or rod preferably is rotatably attached to the interferometer unit. The point of attachment to the interferometer unit preferably is vertically above the center of gravity of the interferometer unit. In embodiments having three or more suspension members, the suspension members can be attached to the interferometer unit at a location that is in or below a horizontal plane containing the center of gravity of the interferometer unit.

The suspension member can be directly attached to the support member or it can be attached to the support member through a mounting device. The mounting device, which is disposed between the support member and the suspension member, has a stiffness in the axial direction that is less stiff than a stiffness of the suspension member in the axial direction. According to some embodiments, the mounting device includes a piston supported by gas or a vacuum so as to absorb vibrations in the axial direction.

The stage can be a reticle stage or a substrate stage, and thus the interferometer can measure the position of the reticle or the substrate stages. In some embodiments, the interferometer unit includes interferometers for the reticle stage and for the substrate stage.

In some embodiments, a plurality of interferometer units are separately suspended from a support member and measure the position of the stage relative to the projection system in different directions (for example, different orthogonal directions). Alternatively, the plurality of interferometer units can be attached to each other so that their positions are fixed relative to each other.

The support member can be a frame from which the interferometer unit(s) is/are suspended. The frame can also suspend the projection system and support the reticle stage. Alternatively, the frame supporting the interferometer unit(s) can be separate from the frame that supports the reticle stage and/or projection system. The frame can be mounted on vibration isolation mounts.

BRIEF DESCRIPTION OF THE DRAWINGS

The invention will be described in conjunction with the following drawings of exemplary embodiments in which like reference numerals designate like elements, and in which.

DETAILED DESCRIPTION OF EMBODIMENTS

In accordance with aspects of the invention, the interferometer system is supported separately from the projection system, and preferably separately from the other components of the lithography apparatus such as the wafer and the reticle stages. In the illustrated embodiments, one or more interferometer units holding components of the reticle and wafer interferometer systems are suspended from a support member (or frame) that also suspends the projection system. However, the invention also can be implemented by providing a separate support frame from which only the interferometer unit(s) is/are suspended. That is, a first support member or frame can be provided to support the projection system and/or reticle stage while a second support member or frame can be provided to support (by suspension) the interferometer unit(s). In addition, the invention can be applied to systems that support the projection system by means other than suspension. For example, the invention can be applied to systems in which the projection system is rigidly held to a support frame, as is well known, rather than being suspended. In such an arrangement, the interferometer unit(s), however, would be suspended from either the support member (or frame) that rigidly supports the projection system or from a separate support member (or frame).

Figure 1:
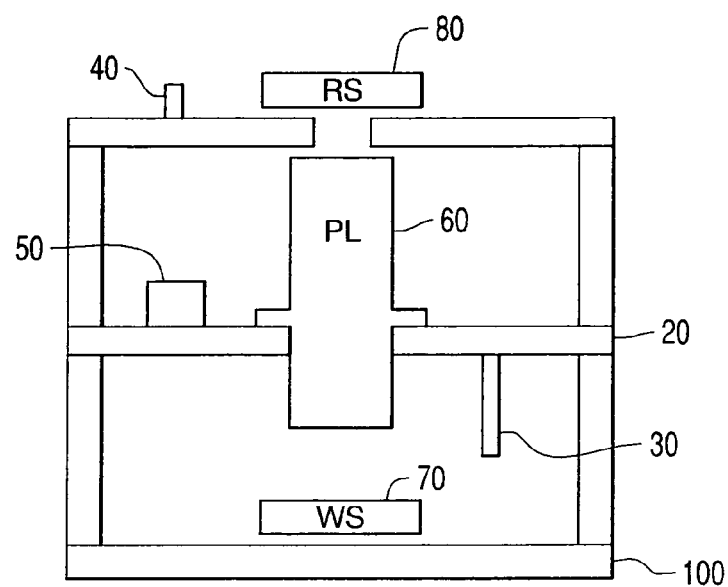
FIG. 1 is a simplified elevational view illustrating a conventional lithography apparatus.
Figure 2:
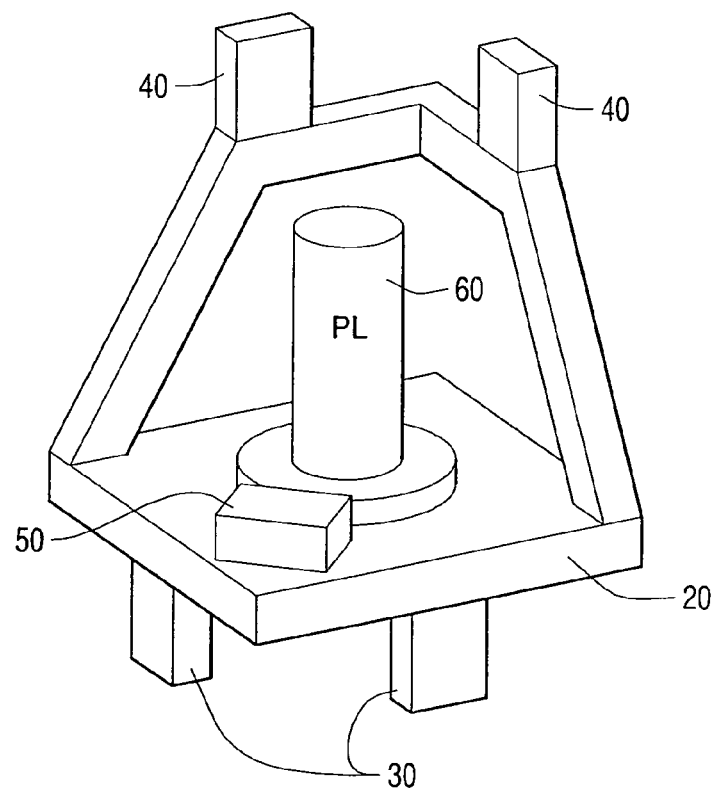
FIG. 2 is a simplified perspective view of part of the body of the lithography apparatus in FIG. 1.
Figure 3:
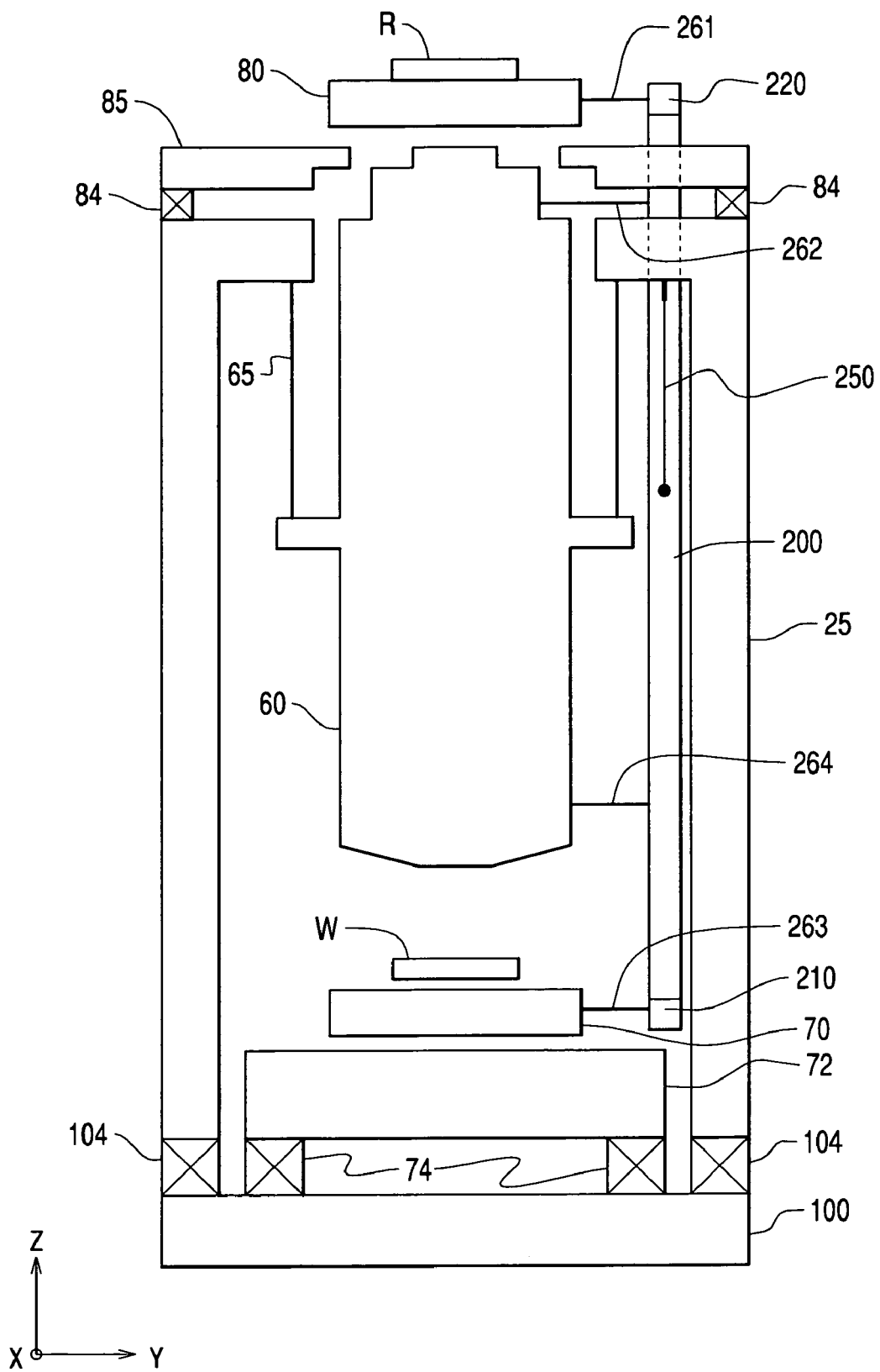
FIG. 3 is an elevational view of a lithography apparatus to which aspects of the invention are applied.

FIG. 3 illustrates a lithography apparatus according to one embodiment of the invention. A support member or frame 25 is mounted to a base unit 100, either directly or by vibration isolation mounts 104. Vibration isolation mounts 104 can be passive or active devices. Passive vibration isolation mounts typically include resilient components made from rubber and/or including gas or other damping devices. Active vibration isolation mounts include a precisely controlled and actively driven member such as a voice-coil motor and/or gas-driven piston unit whose movement is controlled by controlling the supply of gas to opposite sides of a piston.

A wafer stage base 72 is mounted to the base unit 100, for example, by active or passive vibration isolation mounts 74. A wafer stage 70 that holds a wafer W is supported by the wafer stage base 72. As is well known, the wafer stage 70 moves in the X and Y directions to expose multiple shot areas on the wafer to a pattern projected through projection system 60.

Projection system 60 is suspended from the support member 25 by three suspension members 65 (only two are shown in FIG. 3). The suspension members 65 can be wires or rods that are stiff in the Z direction but flexible in the X and Y directions. The projection system 60 can be supported, for example, in the manner described and shown in WO 2006/038952 published on Apr. 13, 2006. The disclosure of WO 2006/038952 is incorporated herein by reference in its entirety. Active or passive vibration isolation units can be provided between the support member 25 and each suspension member 65 to prevent Z-direction vibrations from transmitting to the suspension members 65 from the support member 25.

A reticle stage base 85 is mounted on the support member 25, for example, by passive or active vibration isolation mounts 84. A movable reticle stage 80 holding a reticle R is controlled to move in the X and Y directions on the reticle stage base 85. An illumination optical system (not shown) also is provided and can be entirely mounted on, or have components mounted on, the support member 25.

Figure 4:
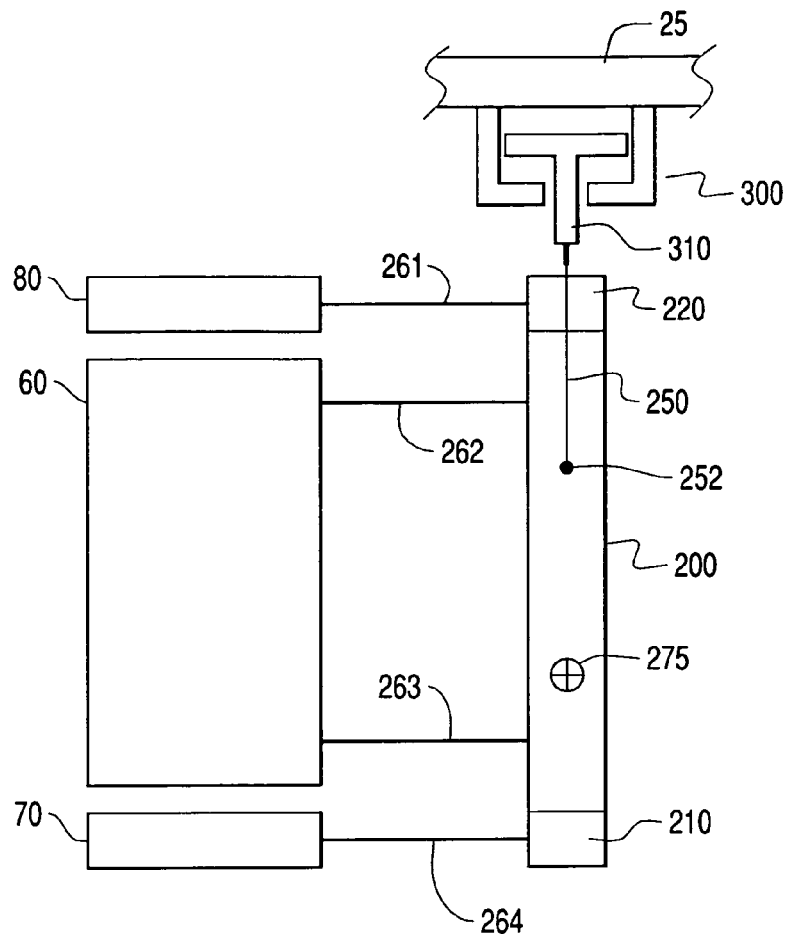
FIG. 4 schematically illustrates an interferometer unit according to one embodiment of the invention.

An interferometer unit 200, shown in FIGS. 3 and 4, is suspended from the support member 25 by a suspension member 250. Member 250 is stiff in the Z direction but flexible in the X and Y directions. Member 250 can be a wire, rod, or beam, for example. A first end 252 of the flexible suspension member 250 is attached to the interferometer unit 200 at a position located above the center of gravity 275 of the interferometer unit 200. The first end 252 of member 250 should be attached to the interferometer unit 200 in a manner that allows it to rotate freely relative to the interferometer unit 200. This rotatable attachment of the flexible suspension member 250 to the interferometer unit 200 above the center of gravity 275 enables the interferometer unit 200 to hang freely with the desired orientation. For example, if the suspension member 250 is a flexible wire, the end of the wire can be rigidly attached to the interferometer unit 200 because the wire itself can bend or twist to act like a flexible joint. If the suspension member 250 is a beam or a rod that is relatively stiff in bending, then flexible joints should be provided, preferably at both ends of the suspension member 250. Each flexible joint can be, for example, a universal joint, a ball joint, a ball-in-socket, etc.

In the embodiment of FIG. 4, the second, upper end of the flexible suspension member 250 is attached to an isolation member 300 that is supported by the support member 25. In particular, the second end of flexible suspension member 250 is attached to a piston 310 of isolation member 300. The isolation member 300 is filled with gas (or a vacuum) such that it has a low stiffness in the Z-direction. Therefore, isolation member 300 reduces or prevents Z-direction vibrations from being transmitted to the suspension member 250 (and thus to the interferometer unit 200) from the support member 25. Isolation member 300 also provides the lifting force to support the weight of the interferometer unit 200. Other examples of structures that can be used as isolation member 300 include: rubber or elastomer members, attractive or repulsive magnets (permanent magnets, electromagnets or a combination), mechanical springs (coil, leaf, etc.), or any combination of passive and active isolation devices. Isolation member 300 also can be provided at the other (lower) end of suspension member 250.

In the FIG. 4 embodiment, a reticle stage interferometer 220 and a wafer stage interferometer 210 are mounted to the interferometer unit 200. The invention also could be implemented by attaching only one of the reticle stage or wafer stage interferometers to the interferometer unit 200.

The reticle stage interferometer 220 emits a measurement beam 261 to the reticle stage 80 and a measurement beam 262 to the projection system 60 so that the position of the reticle stage 80 relative to the projection system 60 can be determined. This information then is used to control the movement of the reticle stage 80. The wafer stage interferometer 210 emits a measurement beam 264 to the wafer stage 70 and a measurement beam 263 to the projection system 60. Based on measurement beams 263 and 264, the position of the wafer stage 70 relative to the projection system 60 can be determined similar to the way in which the position of the reticle stage 80 relative to the projection optical system 60 is determined. For simplicity of explanation, each measurement beam 261-264 is referred to in the singular; however, as is known, each beam 261-264 can be one or more beams depending on the number of axes measured. For example, each beam can include four or more beams, and measurements can be obtained in the X, Y, Z, $\theta X$, $\theta Y$ and $\theta Z$ axes.

Figure 6:
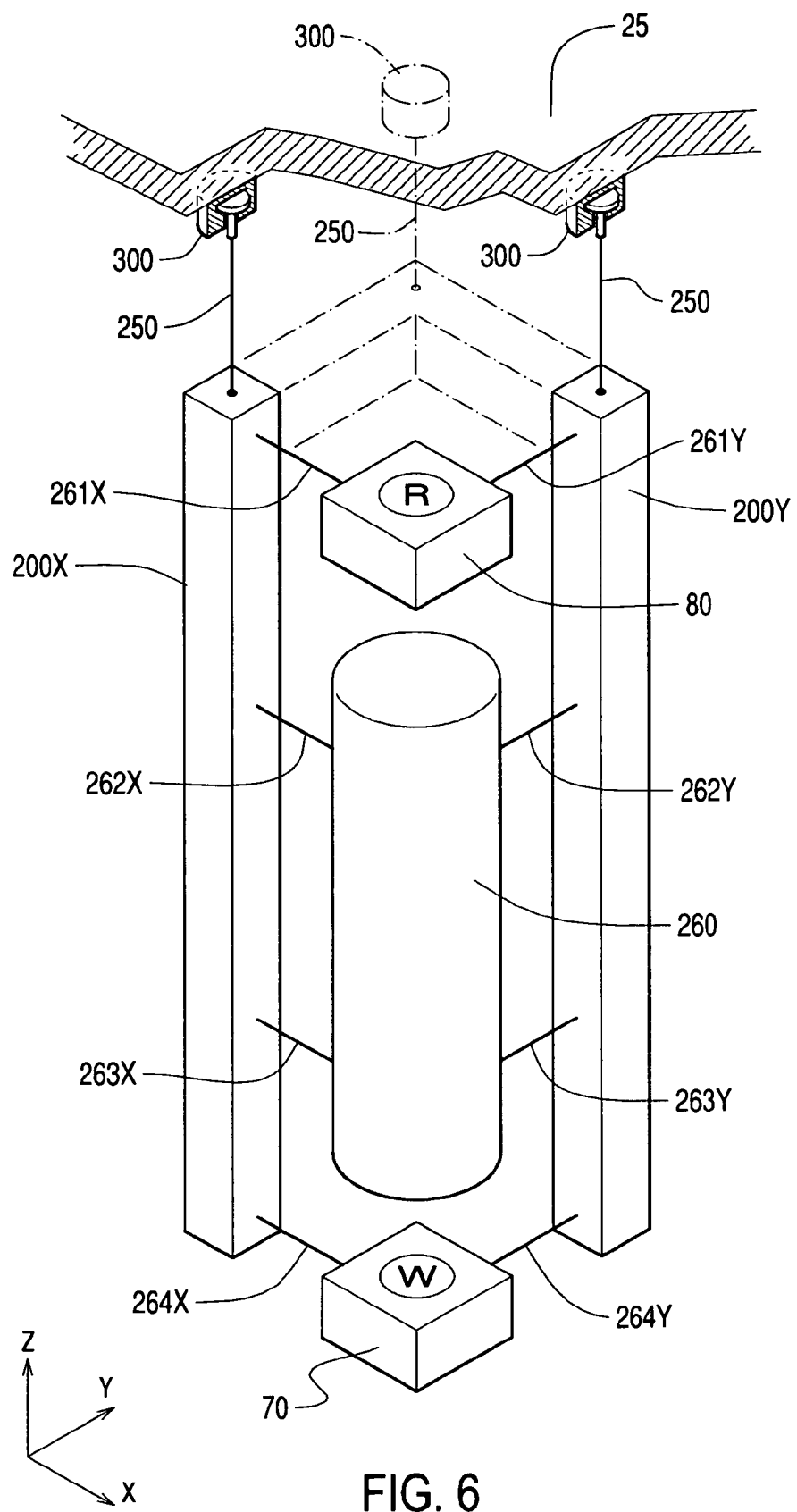
FIG. 6 illustrates an arrangement in which separate X and Y interferometer units are provided.

FIG. 4 illustrates beams 261-264 extending in a single direction. However, as is known, the position of the stages 70/80 relative to the projection system 60 usually is determined in both the X and Y directions. Thus, FIG. 4 is merely a simplified diagram. The stage position preferably is measured in six degrees of freedom (X, Y, Z, $\theta X$, $\theta Y$ and $\theta Z$). The interferometer unit 200 could be L-shaped so as to hold reticle stage and wafer stage interferometers that emit beams in the X and Y directions. Alternatively, as shown in FIG. 6, separate interferometer units 200X and 200Y can be provided to obtain information in the X and Y directions. FIG. 6 also shows (in phantom) an L-shaped bracket that can be provided to rigidly fix the interferometer units 200X and 200Y to each other.

Figure 5:
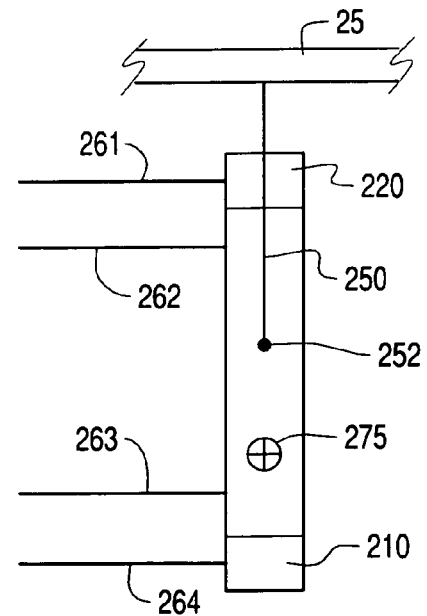
FIG. 5 illustrates an interferometer unit according to a second embodiment of the invention.

FIG. 5 shows a second embodiment in which the flexible suspension member 250 is directly attached to the support member 25 without any vertical isolation piston or other structure between the members 25 and 250. In this implementation, there is no vertical isolation between the support member 25 and the interferometer unit 200. This implementation may be more appropriate for architectures in which the interferometer unit is supported by a member (or frame) separate from the member (or frame) that supports the reticle stage (and possibly the projection system), which tends to receive vibrations due to movement of the reticle stage. That separate support member (or frame) for the interferometer unit 200 preferably is vibrationally isolated from the ground by providing active or passive vibration isolation mounts between the support member (or frame) and the ground or base unit on which the support member (or frame) is mounted.

An alternative embodiment would be to incorporate the vertical compliance in the suspension member 250 itself. This could be done by using an axially flexible member such as a spring or elastic strap/band as the suspension member.

FIG. 6 illustrates an embodiment in which an X-direction interferometer unit 200X and a Y-direction interferometer unit 200Y are provided. Each interferometer unit is suspended in the manner that was described in conjunction with FIG. 4. The X-direction interferometer unit 200X supports a reticle interferometer that emits a reticle stage beam 261X and a projection system beam 262X, whereas the Y-direction interferometer unit 200Y supports a reticle stage interferometer that emits a Y-direction reticle stage beam 261Y and a Y-direction projection system beam 262Y. Using these beams, the position of the reticle stage 80 relative to the projection system 60 is determined in both the X and Y directions. Each of the beams 261X, 261Y, 262X and 262Y consists of one or more beams so as to measure position in one or more axes, preferably in X, Y, Z, θX, θY and θZ directions. The X-direction interferometer unit 200X and the Y-direction interferometer unit 200Y respectively emit wafer stage and projection system beams 263X, 264X, 263Y and 264Y (each consisting of one or more beams) so that the position of the wafer stage 70 relative to the projection system 60 can be determined in at least the X and Y directions, and preferably in X, Y, Z, θX, θY and θZ directions, similar to the manner in which determination is made for the reticle stage 80.

A single suspension member can be provided for the, or each, interferometer unit, or each interferometer unit can be supported by more than one suspension member. For example, according to one embodiment, each interferometer unit is supported by three suspension members. If there are three or more suspension members for an interferometer unit, the point of attachment of the suspension members to the interferometer unit need not be above the interferometer unit center-of-gravity, but can be in or below the horizontal plane containing the interferometer unit center-of-gravity.

Attaching the X and Y interferometer units 200X and 200Y to each other, for example, with one or more L-shaped brackets (one is shown with phantom lines in FIG. 6), keeps the units properly oriented relative to each other. In addition, suspending the assembly formed by the joined units with a third suspension member (also shown with phantom lines in FIG. 6) reduces rotation of the interferometer unit assembly relative to the projection system 60. When additional stabilization of the interferometer units is desired, actuators, preferably non-contact electromagnetic actuators such as voice-coil motors, for example, can be provided to prevent the interferometer unit(s) from moving excessively in the θX, θY and θZ directions. It is noted that the tendency of the interferometer unit(s) to move increases as the number of suspension members decreases (a single suspension member permitting more movement than arrangements using three or more suspension members) and as the flexibility of the suspension member(s) increases. Thus, if three or more suspension members are used, particularly if the suspension members are rods or beams, no actuators may be needed to further stabilize the interferometer unit(s).

The lithography apparatus can be a step-and-repeat apparatus that exposes the pattern onto the substrate while the substrate is stationary or it can be a scanning lithography apparatus that exposes the pattern onto the substrate while the substrate is moving. The lithography apparatus can use immersion technology in which an immersion liquid is disposed between the projection system and the substrate.

The lithography apparatus of the above-mentioned embodiments can be manufactured by incorporating and optically adjusting an illumination optical system composed of a plurality of lenses and a projection system into the main body of the lithography apparatus, and installing the reticle stage and the wafer stage composed of a plurality of mechanical parts to the main body of the lithography apparatus, connecting wires and pipes, and performing overall adjustment (electrical adjustment, operation check, etc.). Furthermore, it is preferable that manufacturing of the lithography apparatus is performed in a clean room with controlled temperature and cleanliness.

Furthermore, when a semiconductor device is manufactured by using the lithography apparatus of the above-described embodiments, the semiconductor device is manufactured by a step of designing a performance capability and function of the device, a step of manufacturing a reticle based on the designing step, a step of forming a wafer from a silicon material, a step of performing alignment by the lithography apparatus of the above-mentioned embodiment and exposing a pattern of the reticle onto a wafer, a step of forming a circuit pattern such as etching or the like, a step of assembling a device (including a dicing process, a bonding process, a packaging process), a step of testing, and the like.

This invention can be applied to a liquid crystal panel manufacturing exposure apparatus disclosed in, for example, International Publication No. WO 99/49504. Furthermore, this invention can be applied to a lithography apparatus using extreme ultraviolet light (EUV light) having a wavelength of several nm-100 nm as an exposure beam.

Furthermore, this invention is not limited to the application for the lithography apparatus for manufacturing a semiconductor device. For example, this invention can be applied to a lithography apparatus for manufacturing various devices such as a liquid crystal display element formed on a square-shaped glass plate, or a display device such as a plasma display or the like, or an imaging element (CCD), a micromachine, a thin-film magnetic head, a DNA chip, or the like. Furthermore, this invention can be applied to a lithography process (lithography apparatus) in which a mask (photomask, reticle, or the like) having a mask pattern of various devices is formed by using a photolithographic process.

While the invention has been described with reference to preferred embodiments thereof, which are exemplary, it is to be understood that the invention is not limited to the preferred embodiments or constructions. The invention is intended to cover various modifications and arrangements. In addition, while the various elements of the preferred embodiments are shown in various combinations and configurations, that are exemplary, other combinations and configurations, including more, less or only a single element, are also within the spirit and scope of the invention.

What is claimed is:

1. A lithography apparatus, comprising:
   a projection system;
   a stage for holding an object;
   an interferometer unit on which an interferometer is mounted, the interferometer emitting a first measurement beam to the projection system and emitting a second measurement beam to the stage, a position of the stage relative to the projection system being determined from the first and second measurement beams; and
   a support member from which the interferometer unit is suspended, the interferometer unit being movable relative to the support member and being moveable relative to the projection system.

2. The lithography apparatus according to claim 1, further comprising at least one suspension member that flexibly suspends the interferometer unit from the support member.

3. The lithography apparatus according to claim 2, wherein the suspension member is stiff in an axial direction and flexible in directions orthogonal to the axial direction.

4. The lithography apparatus according to claim 3, wherein the suspension member is directly attached to the support member.

5. The lithography apparatus according to claim 3, further comprising a mounting device between the suspension member and the support member, the mounting device has a stiffness in the axial direction that is less stiff than a stiffness of the suspension member in the axial direction.

6. The lithography apparatus according to claim 5, wherein the mounting device includes a piston supported by gas so as to absorb vibrations in the axial direction.

7. The lithography apparatus according to claim 2, wherein the suspension member is a wire.

8. The lithography apparatus according to claim 7, wherein the wire is rotatably attached to the interferometer unit.

9. The lithography apparatus according to claim 2, wherein the suspension member is a rod.

10. The lithography apparatus according to claim 9, wherein the rod is rotatably attached to the interferometer unit.

11. The lithography apparatus according to claim 2, wherein the suspension member is attached to the interferometer unit at a location that is vertically above a center of gravity of the interferometer unit.

12. The lithography apparatus according to claim 1, wherein the stage is a substrate stage and the object is a substrate that is to be exposed.

13. The lithography apparatus according to claim 12, further comprising:
    a reticle stage that holds a reticle having a pattern that is to be projected through the projection system onto the substrate; and
    the interferometer unit also mounts an interferometer that emits a third measurement beam to the reticle stage and a fourth measurement beam to the projection system, a position of the reticle stage relative to the projection system being determined from the third and fourth measurement beams.

14. The lithography apparatus according to claim 1, wherein the stage is a reticle stage and the object is a reticle having a pattern that is to be projected through the projection system.

15. The lithography apparatus according to claim 1, wherein the interferometer unit is a first interferometer unit that emits the measurement beams in a first direction; and further comprising:
    a second interferometer unit similar to the first interferometer unit and that emits measurement beams in a second direction that crosses the first direction, the second interferometer unit is suspended from the support member separately from the first interferometer unit.

16. The lithography apparatus according to claim 1, wherein the projection system also is mounted to the support member.

17. The lithography apparatus according to claim 16, wherein the projection system is suspended from the support member.

18. The lithography apparatus according to claim 16, wherein the stage is supported by the support member.

19. The lithography apparatus according to claim 1, wherein the support member is a frame.

20. The lithography apparatus according to claim 19, wherein the frame is mounted on vibration isolation mounts.

21. A lithography apparatus, comprising:
    a projection system;
    a stage for holding an object;
    an interferometer unit on which an interferometer is mounted, the interferometer emitting a first measurement beam to the projection system and emitting a second measurement beam to the stage, a position of the stage relative to the projection system being determined from the first and second measurement beams;
    a support frame; and
    at least one suspension member attached between the support frame and the interferometer unit by which the interferometer unit is suspended from the support frame, the suspension member being stiff in an axial direction and flexible in directions orthogonal to the axial direction, and the suspension member does not support the projection system.

22. The lithography apparatus according to claim 21, wherein the suspension member includes a wire.

23. The lithography apparatus according to claim 22, wherein the wire is rotatably attached to the interferometer unit.

24. The lithography apparatus according to claim 21, wherein the suspension member includes a rod.

25. The lithography apparatus according to claim 24, wherein the rod is rotatably attached to the interferometer unit.

26. The lithography apparatus according to claim 21, wherein the suspension member is attached to the interferometer unit at a location that is vertically above a center of gravity of the interferometer unit.

27. The lithography apparatus according to claim 21, wherein the suspension member is directly attached to the support frame.

28. The lithography apparatus according to claim 21, further comprising a mounting device between the suspension member and the support frame, the mounting device has a stiffness in the axial direction that is less stiff than a stiffness of the suspension member in the axial direction.

29. The lithography apparatus according to claim 28, wherein the mounting device includes a piston supported by gas so as to absorb vibrations in the axial direction.

30. The lithography apparatus according to claim 21, wherein the stage is a substrate stage and the object is a substrate that is to be exposed.

31. The lithography apparatus according to claim 30, further comprising:
a reticle stage that holds a reticle having a pattern that is to be projected through the projection system onto the substrate; and
the interferometer unit also mounts an interferometer that emits a third measurement beam to the reticle stage and a fourth measurement beam to the projection system, a position of the reticle stage relative to the projection system being determined from the third and fourth measurement beams.

32. The lithography apparatus according to claim 21, wherein the stage is a reticle stage and the object is a reticle having a pattern that is to be projected through the projection system.

33. The lithography apparatus according to claim 21, wherein the interferometer unit is a first interferometer unit that emits the measurement beams in a first direction; and further comprising:
a second interferometer unit similar to the first interferometer unit and that emits measurement beams in a second direction that crosses the first direction, the second interferometer unit is suspended from the support frame by a second suspension member separately from the first interferometer unit.

34. The lithography apparatus according to claim 21, wherein the projection system also is mounted to the support frame.

35. The lithography apparatus according to claim 34, wherein the projection system is suspended from the support frame.

36. The lithography apparatus according to claim 34, wherein the stage is supported by the support frame.

37. The lithography apparatus according to claim 21, wherein the support frame is mounted on vibration isolation mounts.

38. A method of assembling a lithography apparatus, comprising:
providing a projection system;
providing a stage for holding an object;
providing an interferometer unit on which an interferometer is mounted, the interferometer emitting a first measurement beam to the projection system and emitting a second measurement beam to the stage, a position of the stage relative to the projection system being determined from the first and second measurement beams; and
suspending the interferometer unit from a support member such that the interferometer unit is movable relative to the support member and is moveable relative to the projection system.

39. The method according to claim 38, wherein the interferometer unit is suspended from the support member by at least one suspension member that is stiff in an axial direction and flexible in directions orthogonal to the axial direction.

40. The method according to claim 39, wherein the suspension member is attached to the interferometer unit at a location that is vertically above a center of gravity of the interferometer unit.

41. The method according to claim 39, wherein the suspension member is directly attached to the support member.

42. The method according to claim 39, wherein a mounting device is disposed between the suspension member and the support member, the mounting device having a stiffness in the axial direction that is less stiff than a stiffness of the suspension member in the axial direction.

43. The method according to claim 42, wherein the mounting device includes a piston supported by gas so as to absorb vibrations in the axial direction.

44. The method according to claim 39, wherein the suspension member includes a wire.

45. The method according to claim 44, wherein the wire is rotatably attached to the interferometer unit.

46. The method according to claim 39, wherein the suspension member includes a rod.

47. The method according to claim 46, wherein the rod is rotatably attached to the interferometer unit.

48. The method according to claim 38, wherein the stage is a substrate stage and the object is a substrate that is to be exposed.

49. The method according to claim 48, further comprising:
providing a reticle stage that holds a reticle having a pattern that is to be projected through the projection system onto the substrate; and
wherein the interferometer unit also mounts an interferometer that emits a third measurement beam to the reticle stage and a fourth measurement beam to the projection system, a position of the reticle stage relative to the projection system being determined from the third and fourth measurement beams.

50. The method according to claim 38, wherein the stage is a reticle stage and the object is a reticle having a pattern that is to be projected through the projection system.

51. The method according to claim 38, wherein the interferometer unit is a first interferometer unit that emits the measurement beams in a first direction; and further comprising:
providing a second interferometer unit similar to the first interferometer unit and that emits measurement beams in a second direction that crosses the first direction; and
suspending the second interferometer unit from the support member separately from the first interferometer unit.

52. The method according to claim 38, wherein the projection system also is mounted to the support member.

53. The method according to claim 52, wherein the projection system is suspended from the support member.

54. The method according to claim 52, wherein the stage is supported by the support member.

55. The method according to claim 38, wherein the support member is a frame.

56. The method according to claim 55, wherein the frame is mounted on vibration isolation mounts.

* * * * *